(12) United States Patent
Fasano

(10) Patent No.: US 6,407,927 B1
(45) Date of Patent: Jun. 18, 2002

(54) METHOD AND STRUCTURE TO INCREASE RELIABILITY OF INPUT/OUTPUT CONNECTIONS IN ELECTRICAL DEVICES

(75) Inventor: Benjamin V. Fasano, New Windsor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/387,325

(22) Filed: Aug. 31, 1999

(51) Int. Cl.⁷ .................................................. H05K 7/02
(52) U.S. Cl. ........................ 361/760; 361/743; 361/719; 361/762; 439/591; 439/66
(58) Field of Search ................................ 361/760, 762, 361/764, 795, 743, 798, 719, 748; 439/66, 81, 83, 591, 561, 632, 80

(56) References Cited

U.S. PATENT DOCUMENTS

| | | | |
|---|---|---|---|
| 4,814,855 A | | 3/1989 | Hodgson |
| 5,173,055 A | * | 12/1992 | Grabbe .......................... 439/66 |
| 5,203,075 A | * | 4/1993 | Angulas et al. ............... 29/830 |
| 5,362,656 A | | 11/1994 | McMahon |
| 5,418,691 A | | 5/1995 | Tokura |
| 5,535,101 A | * | 7/1996 | Miles et al. .................. 367/808 |
| 5,706,174 A | | 1/1998 | Distefano et al. |
| 5,810,609 A | * | 9/1998 | Faraci et al. .................... 439/71 |
| 6,142,789 A | * | 11/2000 | Nolan et al. ................... 439/66 |

OTHER PUBLICATIONS

Reynolds, S.D; "Package for Decal applications", *IBM Technical Disclosure Bulletin*, vol. 33, No. 5, Oct. 1990. pp. 246–253.

* cited by examiner

Primary Examiner—Jayprakash N. Gandhi
Assistant Examiner—Hung Bui
(74) Attorney, Agent, or Firm—McGinn & Gibb, PLLC; Ira D. Blecker, Esq.

(57) ABSTRACT

A method and connecting structure includes a first surface and a connection pad on said first surface, wherein, said first surface includes an opening adjacent to said connection pad, and wherein, upon sufficient stress, said opening forms a flap allowing a portion of said connection pad to separate from said first surface.

44 Claims, 3 Drawing Sheets

METHOD AND STRUCTURE TO INCREASE RELIABILITY OF INPUT/OUTPUT CONNECTIONS IN ELECTRICAL DEVICES

BACKGROUND OF THE INVENTION

1. Field of the Invention

The present invention relates in general to the fabrication of electronic substrates and more particularly to forming a flexible electrically conductive surface connection that has improved electrical reliability when subjected to mechanical and thermal stressing.

2. Description of the Related Art

Electronic substrates are typically used for providing interconnection between integrated circuit devices used in information processing, such as computers and control systems. These are traditionally made using either ceramic or polymer dielectrics. With polymer dielectrics, individual layers are built up through drilling, lamination, plating and soldering processes. The final surface metal features include input/output pads that are used to form connections with discrete devices as well as to circuit boards or other substrates. To attain high interconnect densities, the input/output pads are typically arranged in an array on one or both surface of the substrate. These input/output are then used to make electrical and mechanical connections to other devices, often by solders.

Similarly, ceramic substrates are produced by mixing a dielectric powder into a slurry with organic binders and solvents, forming tapes by using a casting process, and making greensheets which are punched to form holes or 'vias' into which a conductive metal paste is deposited along with metal traces that act as wiring. A number of these punched and metallized tapes are stacked in alignment and pressed into an unfired laminate that is subsequently sintered. This is a cofired process in which the ceramic and metal powders are consolidated in essentially a single but often complex heating operation. Conductive surface features are formed and metal plating such as nickel and gold, and often solders are attached. These surface features also provide connections to the electrical conductors within the ceramic and their mechanical and electrical performance are very important to the reliability of the substrate and the entire system.

The coefficient of thermal expansion (CTE) of polymer derived substrates are typically between 15 and 18 ppm. This is mainly the result of filling the polymer with low CTE materials such as E Glass, fused silica, alumina and other inorganic powders which act to reduce the composite CTE of the substrate. The CTE of ceramic substrates are typically about 3–6 ppm.

When bare polymer substrates are solder joined by a solder attach Ball Grid Array (BGA) process to a printed circuit board which typically has as CTE of about 18 ppm and these joined parts are thermal cycled as would be encountered during the daily on-off operations of a computer, the CTE mismatch between the substrate and the board is small. The stress on the solder joins are typically quite small and the fatigue life of these solder joins is very long. This is usually independent of the size of the substrate.

When a semiconductor device is joined to one surface of the substrate using a flip chip attach soldering process, the CTE mismatch between the silicon device with a CTE of 3 ppm and the substrate with a CTE of 15–18 ppm is very high. To maximize the thermal cycle fatigue life of these solder joins, an underfill polymer is applied between the substrate and the silicon device. However, this underfill polymer has the undesirable effect of drastically lowering the effective CTE of the substrate in the region of the substrate under the chip. Thus, when a substrate with a large semiconductor device is mounted onto a circuit board, the substrate and board CTEs are no longer matched and the solder connections can fatigue much sooner in the region under the silicon device.

Likewise, when a low CTE ceramic has input/output pads which are solder joined to a circuit board, the even greater mismatch in CTE (3–6 ppm v. 18 ppm) reduces the fatigue life of the solder joins during thermal cycling. This can be overcome by increasing the length of the solder joints by using, for instance, connections that are made of wires or long solder columns to minimize the stress at the joints.

The reliability of the electrical connection between the substrate and the board is affected by a number of parameters which include the CTE difference between the substrate and the board, the stiffness of both, the size of the array and the height of the solder joint. During thermal cycling the board expands and contracts much more than the ceramic substrate. This movement causes a large strain in the solder connections between the board and substrate, the greatest strain occurring at the outermost connections and the least at the center of the array. Repetitive thermal cycling eventually fatigues the solder connections to failure and this creates an open in the electrical pathway between the substrate and board. The longer the solder column, the greater the resistance to solder fatigue. Column Grid Arrays (CGAs) will withstand much greater cycle to failure than BGAs with all other parameters being the same, however CGAs are less desirable than BGAs since CGAs can be easily damaged in handling and their increased length increases inductance, which can impair electrical performance.

Therefore, there is a need for a structure which can be used on the surface of these types of substrates that would allow processing of typical organic or ceramic substrates through ball attach and card joining techniques and which would accommodate stresses to improve thermal cycle life and reduce failure of the solder joints.

SUMMARY OF THE INVENTION

It is, therefore, an object of the present invention to provide a structure and method for a connecting structure that includes a first surface and a connection pad on the first surface, wherein, the first surface includes an opening adjacent to the connection pad, and wherein, upon sufficient stress, the opening forms a flap allowing a portion of the connection pad to separate from the first surface. The opening is a U-shaped groove through the first surface. The structure further includes a conductive connecting material on the pad, wherein a force on the conductive connecting material forms the flap. The connecting structure is for joining a first structure with a second structure, and the flap is formed by relative movement between the first structure and the second structure. The sufficient force approximates a force necessary to damage the connecting structure. The flap includes a portion of the first surface. The connecting structure further includes a second surface adjacent to the first surface, wherein a bonding strength of the first surface to the second surface in a region of said connection pad allows formation of the flap upon application of the sufficient force.

Another embodiment of the invention is a method of forming a connecting structure which includes forming a first surface, forming a connection pad on the first surface, and forming an opening in the first surface adjacent the connection pad, wherein, upon sufficient stress, the opening forms a flap allowing a portion of the connection pad to separate from the first surface. The forming of the opening includes forming a U-shaped groove through the first surface, wherein a force on the conductive connecting material forms the flap. The connecting structure is for joining a first structure with a second structure, and the flap is formed by relative movement between the first structure and the second structure. The sufficient force approximates a force necessary to damage the connecting structure. The flap includes a portion of the first surface. The method further includes forming a second surface adjacent the first surface, wherein a bonding strength of the first surface to the second surface in a region of said connection pad allows formation of the flap upon application of the sufficient force.

With the invention, input/output pads are mechanically secured to the substrate until a stress which approximates the delamination force required to break away the inventive input/output pad fingers is encountered. When sufficient force in encountered, the inventive structure (onto which the pads are deposited and connected) is allowed to move and accommodate the stressing without disrupting the electrical connection.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

The present invention comprises a flexible electrically conductive metallurgical structure that is designed to improve the mechanical and electrical reliability of soldered pads used for connecting circuitry within a substrate to another device. This connection is typically formed with low temperature solders but may also use electrically conductive polymers or polymers filled with electrically conductive materials to effect the electrical connection.

Figure 1A:
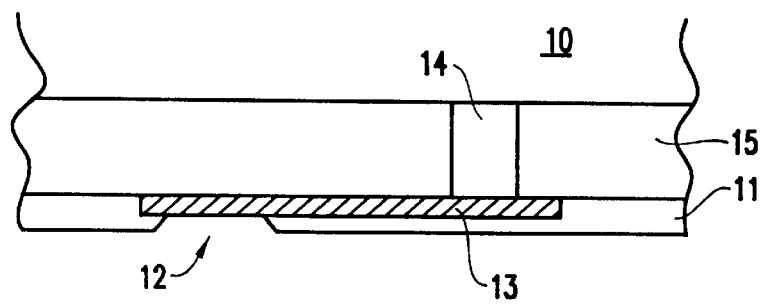
FIGS. 1A–1B are schematic diagrams of a conventional connection structure.
Figure 1B:
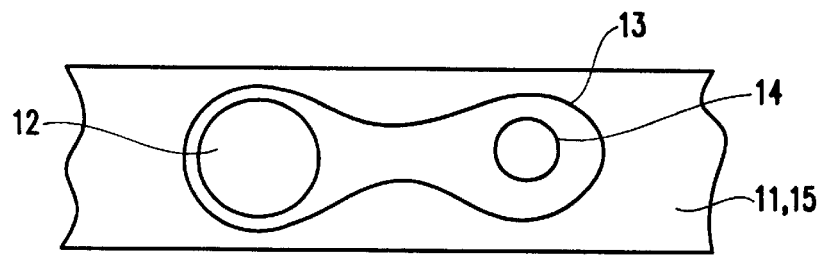

Referring now to the drawings, FIGS. 1A and 1B illustrate a conventional bottom surface metallurgy (BSM) connection that includes an overlying electrically conductive structure 10 (e.g., a wiring layer), an insulating layer 15, a conductor 14 in a via extending through the insulating layer 15, an insulating layer 11 (often referred to as a solder mask), an opening 12 within the insulating layer 11, and a conductor 13 running between the conductor 14 and the opening 12. Typically, with the conventional structure, a solder ball will be placed over the opening 12 to form an electrical connection to the conductor 14 by way of the conductor 13. The conductor 13 is often referred to as a "dog bone" conductor because of its shape, as illustrated more clearly in FIG. 1B, which is a bottom view of the side of view shown in FIG. 1A. As is well known, solder masks can be transparent.

Figure 2A:
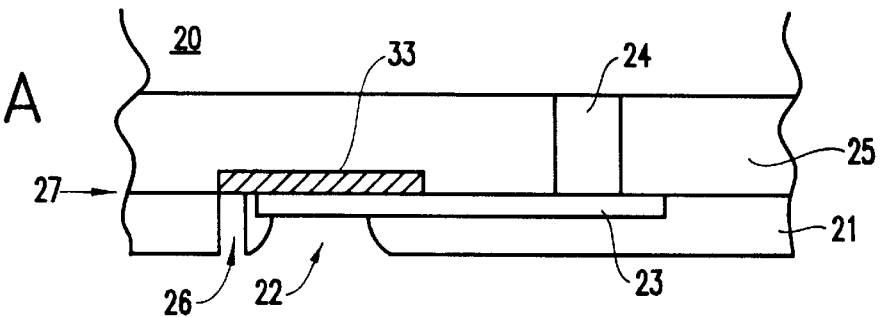
FIGS. 2A–2C are schematic diagrams of a connection structure according to the invention.
Figure 2B:
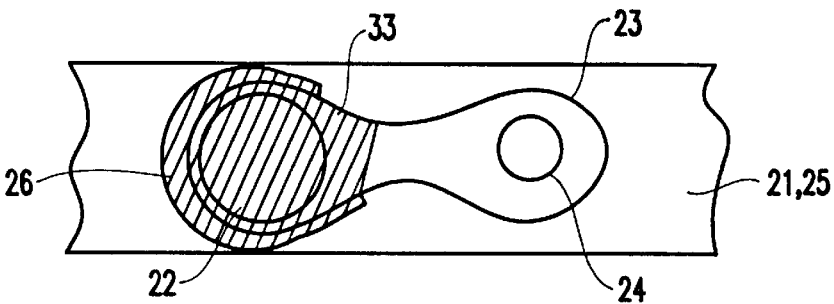

In a similar manner, FIGS. 2A and 2B illustrate an overlying electrically conductive structure 20 (e.g., a wiring layer), an insulating layer 25, a conductor 24 in a via that extends through the insulating layer 25, a flexible insulating layer 21, a patterned release layer 33, an opening 22 within the insulating layer 21, and a flexible conductor 23 running between the conductor 24 and the opening 22 forming a contact pad at 22. However, FIGS. 2A and 2B also illustrate a curved or U-shaped groove opening 26 which extends fully through the insulating layer 21. The area beneath layers 21 and 23 which can separate and form a flap is defined by the shape of the opening 26.

Many different well known techniques can be used to form the U-shaped opening 26, such as laser ablation or photolithographic etching. Further, the opening is not limited to a U-shape, but could be any shape (e.g., squared, arched, oblong, etc.) which would form a flap, as discussed below.

Figure 2C:
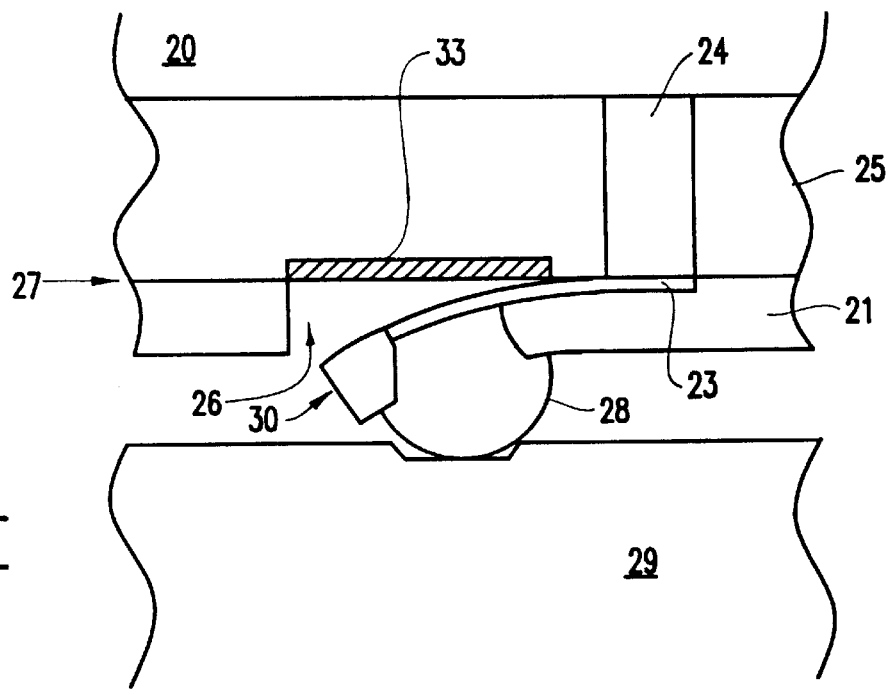

As shown in FIG. 2C, the U-shaped opening 26 allows a portion of the insulating layer 21 and conductor 23 to separate from the insulator 25 thereby forming a flap 30 (when sufficient force is applied) which allows the electrical connection between a conductive connecting material 28 (e.g., a solder ball, conductive polymer, etc.) and the conductor 24 to be maintained even during periods of high mechanical stress. In doing so, the external electrical device 29 remains in contact with the overlying electrical device 20.

The insulators 21 and 25 are selected from a polymer material that can withstand the environments of chip and card joining such as polymides and epoxies. With the invention, the insulators are selected to have a decreased bonding ability over a patterned region 33 defined by opening 26 such that the joint 27 between the insulator layers is somewhat weakened. This enables the flap 30 to separate during periods of sufficient stress.

A patterned region (e.g., release layer) 33 can be formed using a metal which has good adhesion to layer 25 but poor adhesion to layers 23 and 21. For example, the patterned region 33 can include nickel and chromium. Metallic regions 33 are desirable when focused energy processes (such as lasers) are used to defined the openings 26. The metal region 33 acts as a beam stop to control the depth of penetration desired.

Alternatively, the surface between the insulators 25 and 21 could be intentionally left with a number of impurities (e.g., not be cleaned) so that the bonding between the insulator layers 25 and the insulator 21/conductor 23 is intentionally weakened. Similarly, the cleaning process could be limited to selected areas near the contact pad 22 so that there would be sufficient concentrations of impurities (e.g., unclean areas) so as to promote the formation of the flap 30.

Figure 3A:
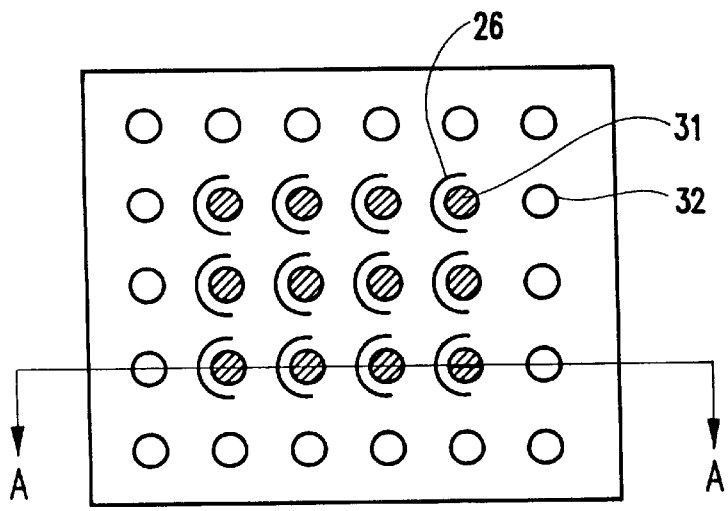
FIGS. 3A–3B are schematic diagrams of a connection structure according to the invention.
Figure 3B:
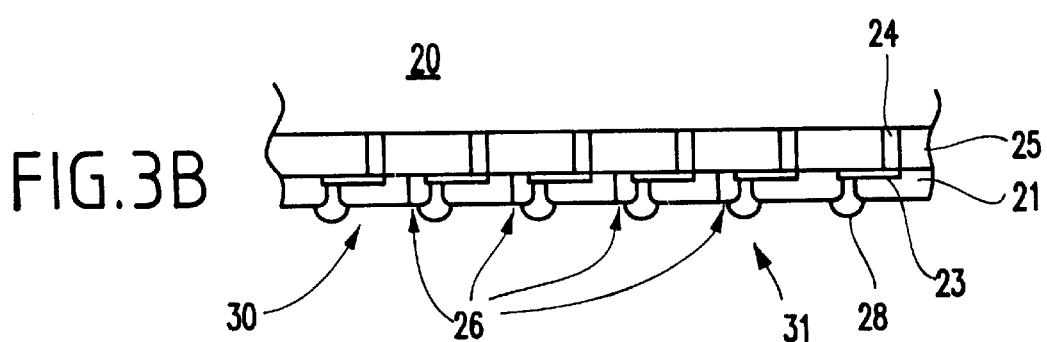

Further, the flexible input/output pad features do not need to be created at all connection points. For example, as shown in FIGS. 3A and 3B, the outer pad connections 32 (light circles) can be conventional connections, while the inner pad connections 31 (dark circles) could include the inventive U-shaped opening 26. Alternatively, only the outer connections 32 could include the inventive structure. One ordinarily skilled in the art would realize, in light of this disclosure, that any pattern of different conductive pad structures could be utilized to achieve any specific design goal. Similarly, while all U-shaped openings are shown oriented in the same direction in FIGS. 3A and 3B, the orientation of the flaps 30 could also be altered to achieve any specific design goals. For example, the flaps 30 (fingers)

could be oriented to flex away from the substrate in a radial pattern from the center of the substrate.

An important feature of the invention is that the solder/polymer connection 28 with the adjacent electronic structure 29 is made before the flap 30 separates from the insulator material 25. Therefore, the flap 30 only separates from the structure when sufficient force is experienced during subsequent operation after the substrate is joined to an adjacent electronic structure and CTE stresses develop. Therefore, the invention is different from other flexible substrates in that it supplies structural support up to the point where sufficient stress is exerted to have the flap 30 separate from layer 25.

The bond between the insulating layer 21 and the insulator 25 should be experimentally established to be approximately equal to (and preferably slightly less than) the force which would caused the solder connection 28 to separate from either the adjacent electrical device 29 or from the insulator layer 21. In doing so, the invention supplies mechanical support up to the point where the device would be damaged and, at that damage point, the flap 30 releases to prevent damage and allow the electrical connection to remain. Further, since the bonding strength is only reduced in the patterned area 33, the insulator 21 will remain attached to the insulator 25 and only the flap 30 will release.

Figure 4:
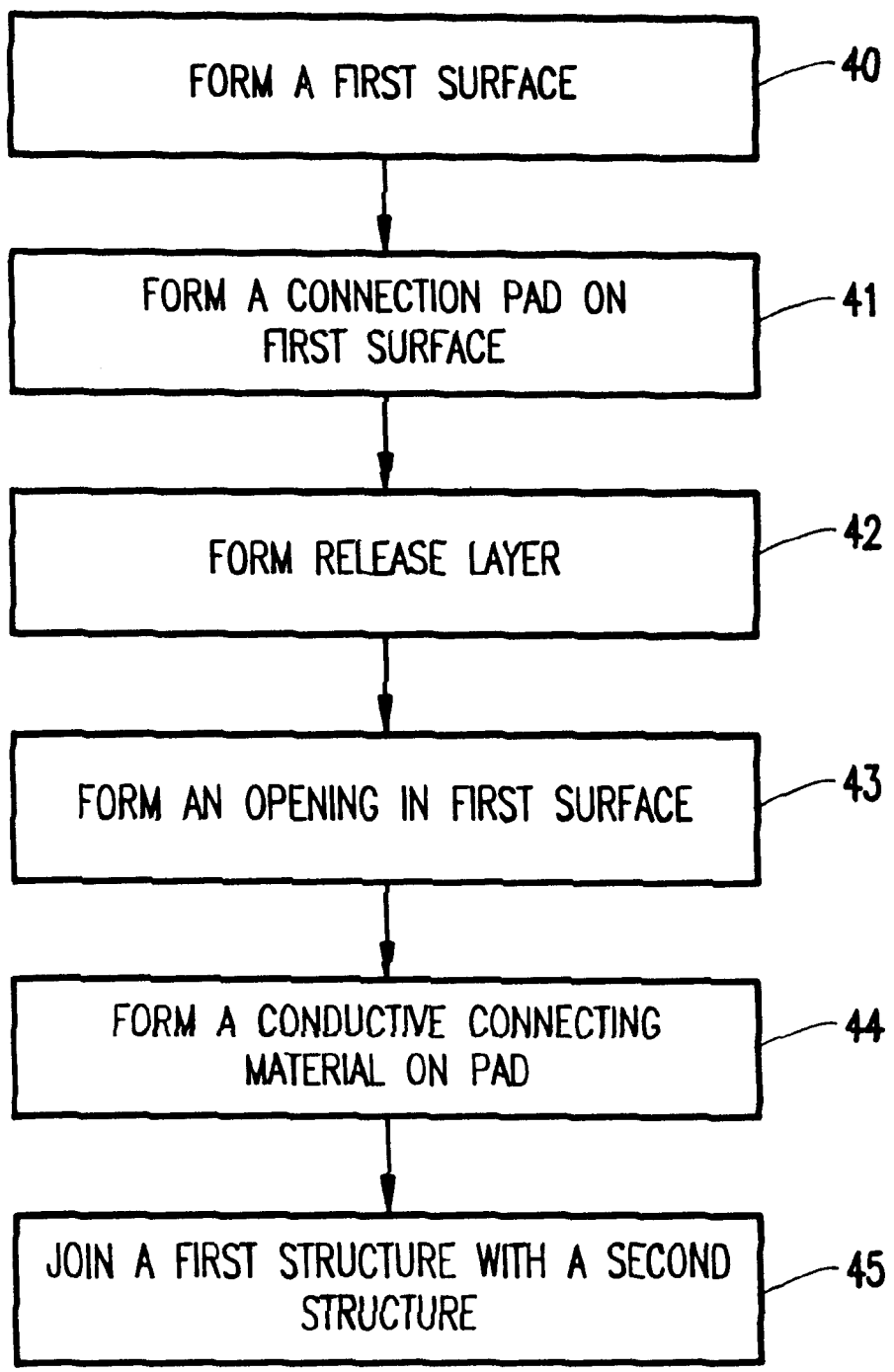
FIG. 4 is a flow diagram illustrating another embodiment of the invention.

FIG. 4 illustrates the invention in flowchart form. More specifically, in item 40 the surface 21 is formed. In item 41, a connection pad 22 is formed. In item 42, the release layer 33 and associated insulating layer 25 are formed adjacent to the surface 21. Then, the opening 26 is made in the surface 21 in item 43. As shown in item 44, the conductive connecting material 28 is formed on the surface 21. Finally, the structure 21 is joined with the structure 29 to complete the connection. As discussed above, this process produces a flap 30 when there is sufficient stress between the two structures 21, 29.

This metallurgical structure serves a number of functions that are critical to creating a high reliability connection. It provides a means of attaching a plurality of electrically conductive surface pads to a second surface which may not otherwise be reliably bonded because of localized or full bonding surface differences in coefficients of thermal expansion (CTE) or other high stress situations. Very high stresses are experienced when the joint between the devices is flexed which occurs, for example, during the mounting of the joined components to an additional connector, during the shearing of the joined components when multiple units are formed and then separated, or during high vibrational or torsional forces that are encountered in use. The inventive structure isolates these stresses from the solder joint and transfers them to an underlying flexible layer which is able to withstand such with little detrimental impact.

The inventive structure connects with associated structures as any conventional area array connection would connect. The inventive structures are essentially flush with the surface of the device. Therefore, the invention is useful with any structure which connects with another structure. For example, the inventive connecting structure can be formed on a substrate which connects an integrated circuit chip with a printed circuit board. Alternatively, the inventive structures can be formed on an integrated circuit chip to allow the chip to be connected to any other structure, such as a substrate or a printed circuit board. Therefore, the invention allows an integrated circuit chip to be connected directly to a printed circuit board without the need for an intervening substrate. Since the invention eliminates the need for an intervening substrate between an integrated circuit chip and a printed circuit board, the invention produces substantial savings in manufacturing processing steps and costs, and reduces the size and weight of the structures produced.

The invention can also be used to provide a more robust process for connecting a rigid ceramic substrate to a board using solder balls as well as in applications where solder columns would typically be required. For example, a polymer layer could be applied to the surface of a fired ceramic, the inventive features could be produced to create the inventive flexible input/output pad fingers, and the fingers could be joined with pads using any typical BGA soldering processes. This allows lower inductance solder balls to be used for high performance packaging needs.

The invention includes a manufacturing method and structure for producing flexible input/output pad connections that allow the surface input/output pads to be processed as traditional surface mount pads. The inventive structures can be individually mechanically separated from the bulk substrate structure without interrupting the electrical integrity of the connection.

Also, the invention allows solder balls to be attached to the substrate using conventional solder BGA production line processes since the flap 30 is produced (e.g., separated) during or after the solder ball attaching process.

While the invention has been described in terms of preferred embodiments, those skilled in the art will recognize that the invention can be practiced with modification within the spirit and scope of the appended claims.

What is claimed is:

1. A connecting structure comprising:
    a first surface; and
    a second surface having a connection pad, said second surface being connected to said first surface,
    wherein, said second surface includes a groove adjacent to said connection pad, and
    wherein, upon sufficient stress, a flap portion of said second surface, defined by said groove, delaminates from said first surface.

2. The connecting structure in claim 1, wherein said groove comprises a U-shaped groove through said second surface.

3. The connecting structure in claim 1, further comprising a conductive connecting material on said connection pad, wherein a force on said conductive connecting material translates through said conductive connecting material to said second surface to form said flap.

4. The connecting structure in claim 1, wherein said connecting structure is for joining a first structure with a second structure, and said flap is formed by said sufficient stress developed during relative movement between said first structure and said second structure.

5. The connecting structure in claim 1, wherein said sufficient stress approximates a force necessary to damage said connecting structure.

6. The connecting structure in claim 1, wherein said flap comprises a portion of said second surface where said connection pad is positioned.

7. The connecting structure in claim 1, wherein a bonding strength of said first surface to said second surface in a region of said connection pad allows formation of said flap upon application of said sufficient stress.

8. An integrated circuit chip comprising:
    a connecting structure, wherein said connecting structure comprises:

a first surface; and a second surface having a connection pad, said second surface being connected to said first surface, wherein, said second surface includes a groove adjacent to said connection pad, and wherein, upon sufficient stress, a flap portion of said second surface, defined by said groove, delaminates from said first surface.

9. The integrated circuit chip in claim 8, wherein said groove comprises a U-shaped groove through said second surface.

10. The integrated circuit chip in claim 8, further comprising a conductive connecting material on said connection pad, wherein a force on said conductive connecting material translates through said conductive connecting material to said second surface to form said flap.

11. The integrated circuit chip in claim 8, wherein said connecting structure is adapted to join said integrated circuit chip with a first structure, and said flap is formed by said sufficient stress developed during relative movement between said first structure and said integrated circuit chip.

12. The integrated circuit chip in claim 8, wherein said sufficient stress approximates a force necessary to damage said integrated circuit chip.

13. The integrated circuit chip in claim 8, wherein said flap comprises a portion of said second surface where said connection pad is positioned.

14. The integrated circuit chip in claim 8, wherein a bonding strength of said first surface to said second surface in a region of said connection pad allows formation of said flap upon application of said sufficient stress.

15. The integrated circuit chip in claim 8, wherein said integrated circuit chip is directly connected to a printed circuit board.

16. A substrate for joining an integrated circuit chip and a printed circuit board, said substrate comprising:

a first surface; and a second surface having a connection pad, said second surface being connected to said first surface, wherein, said second surface includes a groove adjacent to said connection pad, and wherein, upon sufficient stress, a flap portion of said second surface, defined by said groove, delaminates from said first surface.

17. The substrate in claim 16, wherein said groove comprises a U-shaped groove through said second surface.

18. The substrate in claim 16, further comprising a conductive connecting material on said connection pad, wherein a force on said conductive connecting material translates through said conductive connecting material to said second surface to form said flap.

19. The substrate in claim 16, wherein, said flap is formed by said sufficient stress developed during relative movement between said integrated circuit chip and said printed circuit board.

20. The substrate in claim 16, wherein said sufficient stress approximates a force necessary to damage said substrate.

21. The substrate in claim 16, wherein said flap comprises a portion of said second surface where said connection pad is positioned.

22. The substrate in claim 16, wherein a bonding strength of said first surface to said second surface in a region of said connection pad allows formation of said flap upon application of said sufficient stress.

23. A method of forming a connecting structure comprising:

forming a first surface;

forming a second surface having a connection pad, said second surface being connected to said first surface; and forming a groove in said second surface adjacent to said connection pad, wherein, upon sufficient stress, a flap portion of said second surface, defined by said groove, delaminates from said first surface.

24. The method in claim 23, wherein said forming of said groove comprises forming a U-shaped groove through said second surface.

25. The method in claim 23, further comprising forming a conductive connecting material on said connection pad, wherein a force on said conductive connecting material translates through said conductive connecting material to said second surface to form said flap.

26. The method in claim 23, wherein said connecting structure is for joining a first structure with a second structure, and said flap is formed by said sufficient stress developed during relative movement between said first structure and said second structure.

27. The method in claim 23, wherein said sufficient force approximates a stress necessary to damage said connecting structure.

28. The method in claim 23, wherein said flap comprises a portion of said second surface where said connection pad is positioned.

29. The method in claim 23, wherein a bonding strength of said first surface to said second surface in a region of said connection pad allows formation of said flap upon application of said sufficient stress.

30. A method of forming a integrated circuit chip comprising:

forming a connecting structure on said integrated circuit chip, wherein said forming of said connecting structure comprises:

forming a first surface;

forming a second surface having a connection pad, said second surface being connected to said first surface; and forming a groove in said second surface adjacent to said connection pad, wherein, upon sufficient stress, a flap portion of said second surface, defined by said groove, delaminates from said first surface.

31. The method in claim 30, wherein said forming of said groove comprises forming a U-shaped groove through said second surface.

32. The method in claim 30, further comprising forming a conductive connecting material on said connection pad, wherein a force on said conductive connecting material translates through said conductive connecting material to said second surface to form said flap.

33. The method in claim 30, wherein said connecting structure is adapted to join said integrated circuit chip with a first structure, and said flap is formed by said sufficient stress developed during relative movement between said first structure and said integrated circuit chip.

34. The method in claim 30, wherein said sufficient stress approximates a force necessary to damage said integrated circuit chip.

35. The method in claim 30, wherein said flap comprises a portion of said second surface where said connection pad is positioned.

36. The method in claim 30, wherein a bonding strength of said first surface to said second surface in a region of said connection pad allows formation of said flap upon application of said sufficient stress.

37. The method in claim 30, further comprising connecting said integrated circuit chip directly to a printed circuit board.

38. A method of forming a substrate for joining an integrated circuit chip and a printed circuit board, said method comprising:

forming a first surface of said substrate;

forming a second surface having a connection pad, said second surface being connected to said first surface;

forming a groove in said second surface adjacent to said connection pad, and connecting said integrated circuit chip and said printed circuit board to said substrate wherein, upon sufficient stress, a flap portion of said second surface, defined by said groove, delaminates from said first surface.

39. The method in claim 38, wherein said forming of said groove comprises forming a U-shaped groove through said second surface.

40. The method in claim 38, further comprising forming a conductive connecting material on said connection pad, wherein a force on said conductive connecting material translates through said conductive connecting material to said second surface to form said flap.

41. The method in claim 38, wherein said flap is formed by said sufficient stress developed during relative movement between said integrated circuit chip and said printed circuit board.

42. The method in claim 38, wherein said sufficient stress approximates a force necessary to damage said substrate.

43. The method in claim 38, wherein said flap comprises a portion of said second surface where said connection pad is positioned.

44. The method in claim 38, wherein a bonding strength of said first surface to said second surface in a region of said connection pad allows formation of said flap upon application of said sufficient stress.

* * * * *